United States Patent
Franz et al.

(10) Patent No.: US 7,026,551 B2
(45) Date of Patent: Apr. 11, 2006

(54) DROP DOWN CABLE ARM

(75) Inventors: John P. Franz, Houston, TX (US); Arthur G. Volkmann, Spring, TX (US); David L. Vaughn, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/428,038

(22) Filed: May 1, 2003

(65) Prior Publication Data

US 2004/0216911 A1 Nov. 4, 2004

(51) Int. Cl.
*H01B 7/06* (2006.01)

(52) U.S. Cl. .................. 174/69; 174/72 A; 174/DIG. 9; 361/826

(58) Field of Classification Search .................. 174/69, 174/68.3, 48, 49, 97, 72 A, DIG. 9, 135, 174/70 R; 361/825, 826
See application file for complete search history.

(56) References Cited

U.S. PATENT DOCUMENTS

| | | | | |
|---|---|---|---|---|
| 3,138,655 | A | * | 6/1964 | Rajewski et al. ............. 174/69 |
| 4,922,125 | A | | 5/1990 | Casanova et al. |
| 5,571,256 | A | * | 11/1996 | Good et al. .................... 211/26 |
| 6,070,742 | A | * | 6/2000 | McAnally et al. ............ 211/26 |
| 6,305,556 | B1 | | 10/2001 | Mayer |
| 6,326,547 | B1 | | 12/2001 | Saxby et al. |
| 6,392,149 | B1 | * | 5/2002 | Kim et al. ................. 174/72 A |
| 6,407,933 | B1 | | 6/2002 | Bolognia et al. |
| 6,442,030 | B1 | * | 8/2002 | Mammoser et al. ........ 361/727 |
| 6,523,918 | B1 | * | 2/2003 | Baiza ....................... 312/265.1 |
| 6,600,665 | B1 | * | 7/2003 | Lauchner ..................... 361/826 |
| 2001/0037985 | A1 | * | 11/2001 | Varghese et al. ............. 211/26 |

* cited by examiner

*Primary Examiner*—Jinhee Lee

(57) ABSTRACT

A system and method for managing electric cables. A cable arm is utilized to contain cables running to an electronic device. The cable arm having a mounting bracket that enables movement between at least two vertical positions relative to a base bracket is thus selectively moveable between a plurality of positions to permit access to the electronic device.

30 Claims, 4 Drawing Sheets

DROP DOWN CABLE ARM

BACKGROUND

Cable management systems are used in environments where electronic devices are connected with multiple cables. For example, in environments such as data center environments, multiple servers are stacked in rack units to efficiently utilize floor space. Each server may have numerous cables, such as power cords, video cables, mouse cables, keyboard cables, optic cables, universal serial bus cables, serial cables, and numerous other potential cables, that exit the rear of the server. Cable management systems confine the cables to a zone at the rear of the server. The confinement protects the cables against inadvertent unplugging, scraping, and/or crimping that could have detrimental effects on data integrity.

Cable arms are used to collectively hold the cables coupled to each server. However, the cable arm limits access to the rear of the server chassis. Accordingly, access to fans, power supplies, peripheral component interface cards, and other existing or future components is limited. This creates difficulty in the servicing, removal, and/or installation of various components or features at the rear of the device chassis.

BRIEF DESCRIPTION OF THE DRAWINGS

Certain embodiments of the invention will hereafter be described with reference to the accompanying drawings, wherein like reference numerals denote like elements, and.

DETAILED DESCRIPTION

Figure 1:
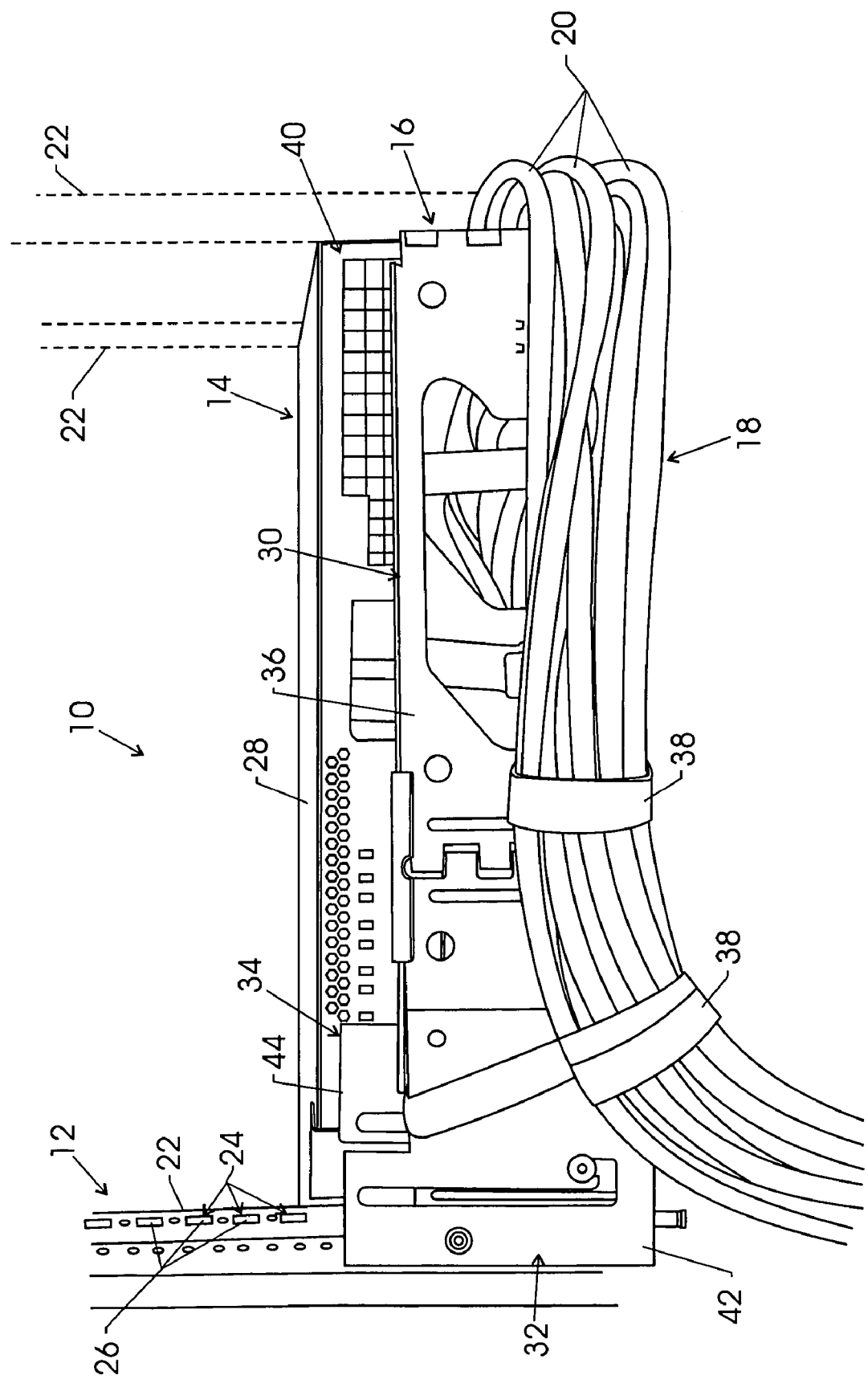
FIG. 1 is a rear view of a system illustrated in accordance with an embodiment of the present invention.

Referring generally to FIG. 1, a system 10 is illustrated as an example of embodiments of the present invention. System 10 may comprise a variety of components, such as a rack 12, an electronic device 14, and a cable management system 16. Cable management system 16 is designed to manage or control a bundle 18 of cables 20.

Rack 12 is representative of a variety of potential racks, such as server racks, utilized in mounting at least one and often multiple electronic devices. Rack 12 may comprise vertical supports 22 to which at least one electronic device 14 is mounted via, for example, rails (not shown). The vertical supports 22 also may comprise a variety of mounting features 24, such as rectangular openings 26. Rectangular openings 26 can be used to facilitate the mounting of rails, cable arms or other attachments.

Electronic device 14 may comprise a variety of electronic devices. For example, a server 28 is illustrated as an example of devices that can be mounted in rack 12. However, other types of devices 14, such as computers, computer equipment, peripheral devices, telecommunications devices and other electronic devices may be mounted in rack 12. Additionally, a plurality of electronic devices 14 may be mounted sequencially in a generally vertical direction along vertical supports 22.

Cable management system 16 may have a variety of configurations. In the embodiment illustrated, cable management system 16 comprises a cable arm 30 having a first end 32 and a second end 34 disposed on generally opposite ends of an arm portion 36. By way of example, first end 32 may be coupled to a selected vertical support 22 of rack 12, and second end 34 may be coupled to electronic device 14. Cable bundle 18 is secured along arm portion 36 via appropriate retention mechanisms, such as straps 38.

When cable management system 16 is in the configuration illustrated in FIG. 1, cable bundle 18 and cable arm 30 are secured at the rear of electronic device 14. For example, the cable arm 30 and cable bundle 18 may be confined to a zone no larger than the size of a back or rear region 40 of electronic device 14. Such configuration maintains cables 20 directly to the rear of electronic 14 when the electronic device is statically positioned within rack 12 and when the device is pulled forward to a service position, e.g. pulled forward on slide rails.

However, to enable access to rear region 40 of electronic device 14, cable management system 16 may be selectively moved between vertical positions. For example, the cable arm 30 may be selectively moved between a raised vertical positon, as illustrated in FIG. 1, and a lowered position, as illustrated in FIG. 2.

Figure 2:
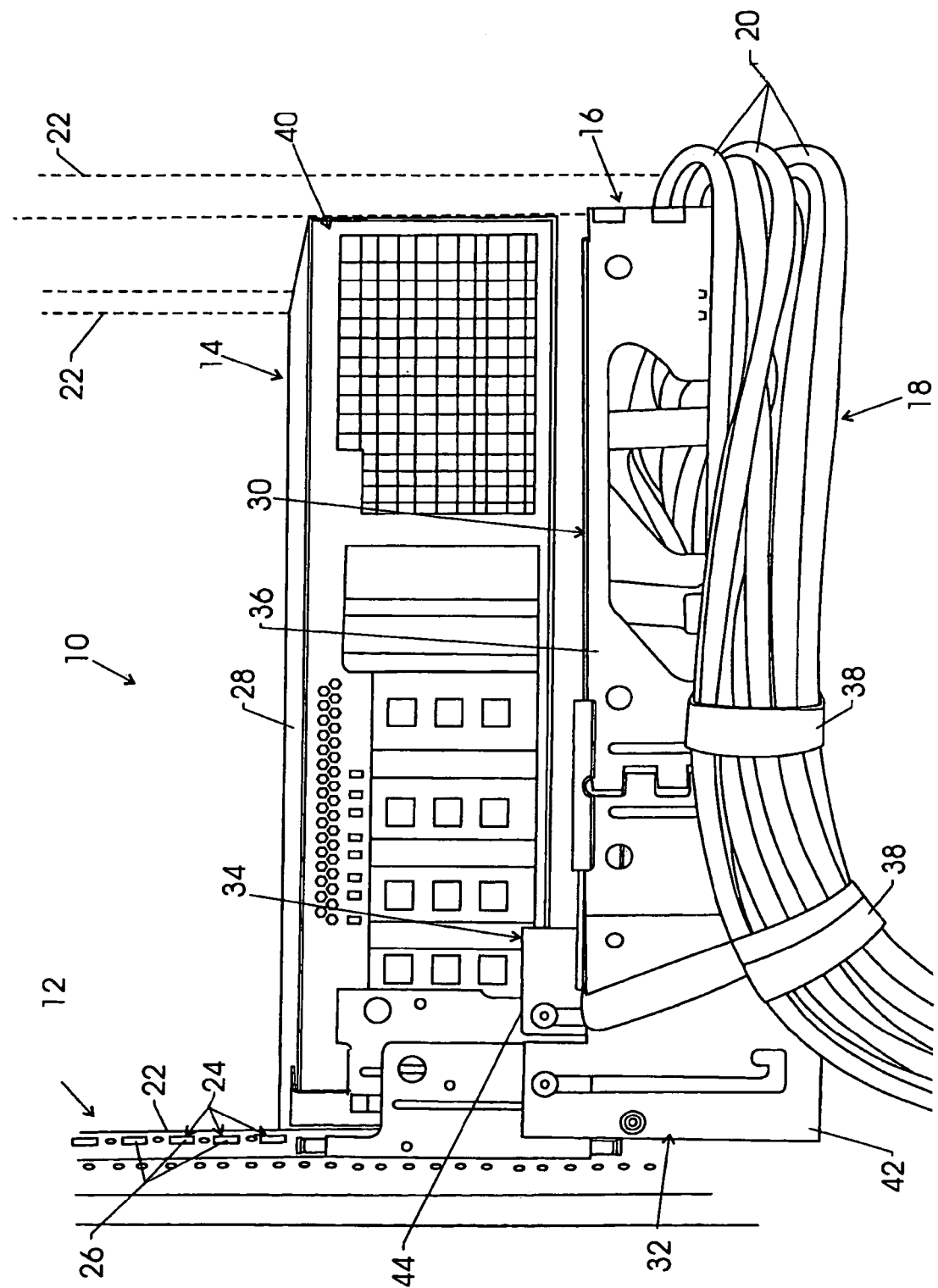
FIG. 2 is a rear view similar to FIG. 1 with an embodiment of a cable arm disposed in a different position.

As further illustrated in FIG. 2, cable management system 16 comprises a mounting bracket 42 disposed at first end 32 and a mounting bracket 44 disposed at second end 34 that enable selective movement of cable arm 30 between the raised position (see FIG. 1) and the lowered position (see FIG. 2). Mounting brackets 42 and 44 also can be configured to permit the selective movement to additional positions, e.g. additional vertical positions. Thus, cable management system 16 maintains cables 20 in a position behind electronic device 14 during normal service, but it enables the selective movement of cables 20 and arm portion 36 to a non-obstructing position with respect to rear region 40 of electronic device 14. Accordingly, access is provided to the rear of electronic device 14 for servicing, component replacement, component removal, component addition, troubleshooting or other operations.

Figure 3:
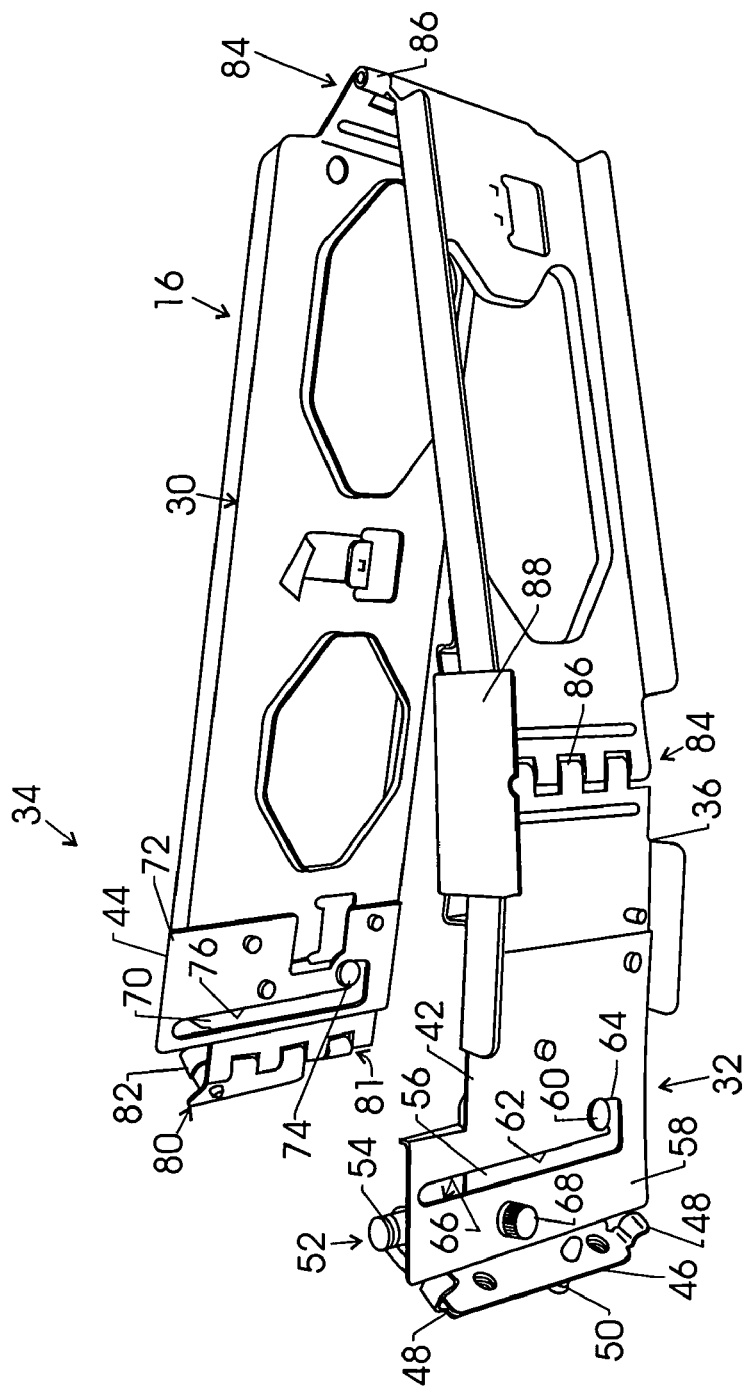
FIG. 3 is an isometric view of an embodiment of the cable arm illustrated in FIGS. 1 and 2.
Figure 4:
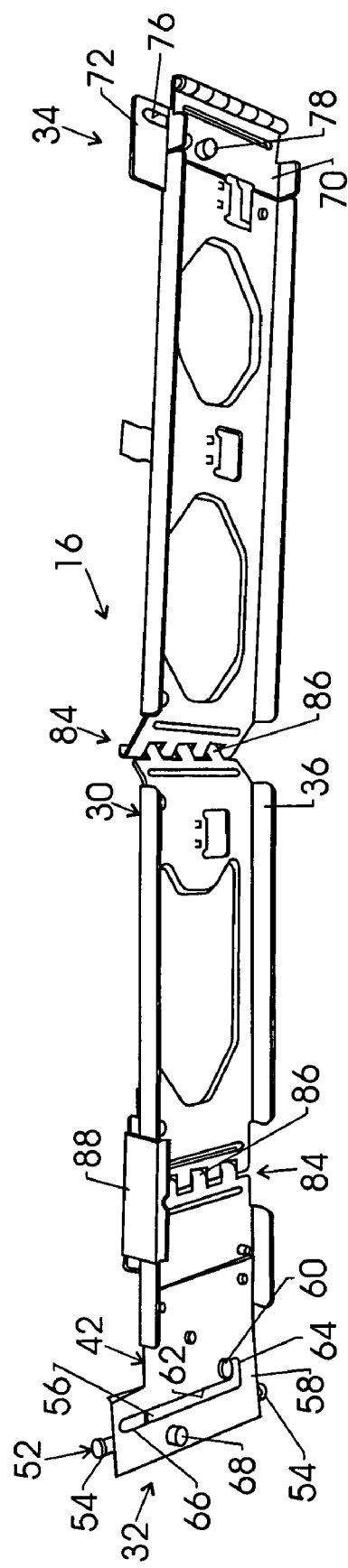
FIG. 4 is an isometric view of the cable arm illustrated in FIG. 3 in a different orientation.

A representative embodiment of cable management system 16 is illustrated in FIGS. 3 and 4. In this embodiment, cable arm 30 is connected to a base bracket 46 by which cable management system 16 may be coupled to rack 12. For example, base bracket 46 may comprise a pair of mounting tabs 48 sized for receipt in rectangular openings 26. Additionally, base bracket 46 may comprise a spring mounted pin 50 positioned for insertion into an opening between mounting tabs 48 once base bracket 46 is securely positioned on vertical support 22. In other words, spring mounted pin 50 is biased into a rectangular opening 26 to prevent inadvertent separation of base bracket 46 from rack 12.

Base bracket 46 may be mounted to cable arm 30 via a pivot 52, as illustrated best in FIG. 3. Pivot 52 may comprise a variety of pivoting mechanisms, such as a hinge. For example, pivot 52 may be formed with at least one, e.g. a pair, of plungers 54 that enable a separable pivot between base bracket 46 and cable arm 30.

In the embodiment illustrated, mounting bracket 42 comprises a first bracket portion 56 and a second bracket portion 58. First bracket portion 56 and second bracket portion 58 may be slideably mounted to each other via a peg 60 slideably captured by a groove 62. By way of example, peg 60 may extend from first bracket portion 56, and groove 62 may be formed in second bracket portion 58. Furthermore, in this example, second bracket portion 58 is coupled to arm portion 36, and first bracket portion 56 is coupled to base bracket 46 which may be secured to rack 12. Thus, the relative position of first bracket portion 56 and second bracket portion 58, as well as cable arm portion 36 and base bracket 46, changes as peg 60 translates along groove 62.

As illustrated, groove 62 may be formed as a generally J-shaped groove having a short groove portion 64 supported on peg 60 when cable arm 30 is in the raised position. Groove 62 also comprises an extended groove portion 66 through which peg 60 translates as cable arm 30 is moved to its lowered position. Additionally, mounting bracket 42 may comprise a locking mechanism 68, such as a lock screw, that may be selectively engaged between first bracket portion 56 and second bracket portion 58 to secure mounting bracket 42 in a desired orientation, e.g., the raised position.

Mounting bracket 44, or alternatively mounting bracket 42, can be replaced with other mechanisms that enable the lowering of cable arm 30 to provide access to the rear of electronic device 14. The illustrated embodiment, however, provides an example in which mounting bracket 44 is similar to the illustrated mounting bracket 42. In other words, mounting bracket 44 comprises a first bracket portion 70 and a second bracket portion 72 slideably engaged with first bracket portion 70. A peg 74 may be slideably captured in a corresponding groove 76 to enable translation of the cable arm 30 between a raised and a lowered position. For example, peg 74 may extend from first bracket portion 70 for engagement with groove 76 formed in second bracket portion 72.

Additionally, groove 76 may again be formed as a generally J-shaped groove having a short groove portion and an extended groove portion for operation similar to that described above with respect to mounting bracket 42. Also, a locking mechanism 78 (see FIG. 4) may be utilized to lock mounting bracket 44 at a desired position, such as the raised position illustrated in FIG. 1.

In the embodiment illustrated, second bracket portion 72 is coupled to arm portion 36, and first bracket portion 70 is connected to a mounting mechanism 80 via a pivot 81, mounting mechanism 80 is used to secure cable arm 30 to electronic device 14. The configuration of mounting mechanism 80 may vary substantially depending on a variety of parameters, including the type of electronic device 14 to which cable arm 30 is attached. For example, mounting mechanism 80 may comprise threaded fasteners 82 positioned for threaded engagement with a corresponding feature on electronic device 14.

With the embodiment illustrated, movement of the cable arm 30 from a raised to a lowered position involves unlocking of mechanisms 68 and 70. Arm portion 36 is then lifted slightly and pulled outwardly to permit the transition of pegs 60, 74 from the short groove portions to the extended groove portions. Arm portion 36 is then moved downwardly as second bracket portions 58, 72 translate with respect to first bracket portions 56, 70 until cable arm 30 is in a lowered position. In this lowered position access is provided to rear region 40 of electron device 14. The cable arm can be moved from the lowered to the raised position by simply reversing this procedure.

It should be noted that although a variety of cable arm portions 36 may be utilized with cable management system 16, the illustrated embodiment of cable arm 30 utilizes an arm portion 36 having a plurality of pivot regions 84. Pivot regions 84 may be formed by hinges 86 that enable the flexing of cable arm portion 36 at a plurality of regions.

Additionally, one or more locking tabs 88 may be used in conjunction with corresponding pivot regions 84 to selectively limit the pivotal motion at that region.

It should further be noted that the system and system components described herein may have a variety of other shapes, sizes and configurations. For example, the overall system may utilize a variety of racks, electronic devices, cable bundles and cable arm styles.

What is claimed is:

1. A system for managing electrical cables, comprising:
   a rack;
   a base bracket coupled to the rack; and
   a cable arm pivotably coupled to the base bracket, the cable arm having a mounting bracket that enables selective movement of the cable arm between at least two vertical positions relative to the base bracket while the cable arm is coupled to the rack.

2. The system as recited claim 1, further comprising a server mounted in the rack and a plurality of cables mounted to the cable arm, the plurality of cables being coupled to the server.

3. The system as recited in claim 1, wherein the mounting bracket comprises a first bracket portion and a second bracket portion slidably mounted to the first bracket portion.

4. The system as recited in claim 3, wherein the first bracket portion comprises a peg and the second bracket portion comprises a slot sized to slidably receive the peg to enable movement of the cable arm between the at least two vertical positions.

5. The system as recited in claim 3, further comprising a locking member to lock the cable arm at a raised vertical position.

6. The system as recited in claim 2, wherein the cable arm further comprises a second mounting bracket disposed at a cable arm end generally opposite the mounting bracket, the second mounting bracket further enabling movement of the cable arm between the at least two vertical positions.

7. The system as recited in claim 5, wherein the locking member comprises a threaded fastener.

8. The system of claim 1, wherein the mounting bracket has a J-shaped slot.

9. The system of claim 1, wherein the cable arm is slideably positionable with respect to the rack.

10. A system for managing cables, comprising:
    a rack;
    an electronic component mounted in the rack; and
    a cable support arm comprising a first mounting bracket having a first hinge coupled to the rack and a second mounting bracket having a second hinge coupled to the electronic component, wherein the first and second mounting brackets enable vertical movement, independent from the first and second hinges, along a closed path from a first position to a second position of the cable support arm to provide access to a rear region of the electronic component while the cable support arm is continuously coupled to the rack and to the electronic component.

11. The system of claim 10, wherein the electronic component comprises a computer component.

12. The system of claim 10, wherein the electronic device is movably mounted to a horizontal positioning mechanism disposed within the rack.

13. The system of claim 10, wherein the first and second mounting brackets each comprise a fastening mechanism and a vertical sliding mechanism.

14. The system of claim 13, wherein the fastening mechanism is independent from the vertical sliding mechanism.

15. The system of claim 10, wherein the closed path comprises a vertical path between the first and second positions and a lateral path at the second position, and the lateral path prevents vertical movement of the cable support arm.

16. The system of claim 10, comprising a retention mechanism configured to hold the cable support arm at the second position, wherein the second position is above the first position.

17. A system for managing cables, comprising:
  a rack;
  an electronic component mounted in the rack;
  a base bracket coupled to the rack; and
  a cable support arm comprising a first bracket pivotably coupled to the base bracket and a second bracket coupled to the electronic component, wherein the first and second brackets comprise a vertical sliding mechanism configured to raise and lower the cable support arm while the cable support arm is coupled to the rack and to the electronic device, and the first and second brackets comprise a vertical retention mechanism configured to secure the vertical sliding mechanism when the cable support arm reaches a raised position relative to the electronic component.

18. The system of claim 17, wherein the cable support arm is collapsible and expandable with horizontal movement of the electronic component.

19. The system of claim 17, wherein the vertical sliding mechanism is movable between first and second vertical positions, the first vertical position configured to position the cable support arm substantially vertically aligned with a horizontal pathway of the electronic component, and the second vertical position configured to position the cable support arm substantially vertically clear of a rear portion of the electronic component.

20. The system of claim 17, wherein the vertical retention mechanism comprises a fastener.

21. The system of claim 17, wherein the vertical retention mechanism comprises a lateral path of the vertical sliding mechanism, and the lateral path prevents vertical movement of the cable support arm.

22. The system of claim 17, wherein the vertical sliding mechanism comprises a closed path.

23. A system for managing cables, comprising:
  a rack;
  a base bracket coupled to the rack; and
  a cable support arm having a mounting bracket hingedly coupled to the base bracket, wherein at least one of the base bracket or the mounting bracket includes a sliding mechanism having a closed path to vertically position the cable support arm to a plurality of different positions with respect to the rack while the cable support arm is coupled to the rack.

24. The system of claim 23, wherein the closed path comprises a vertical path between the plurality of different positions and a lateral path at one or more of the plurality of different positions, and the lateral path prevents vertical movement of the cable support arm.

25. A system for managing cables, comprising:
  a cable support arm, comprising:
    a plurality of hinged members expandable and contractible in a plurality of horizontal positions, wherein the plurality of hinged members extend between first and second mounting brackets,
    wherein the first mounting bracket is coupled to a base bracket via a hinge, and the base bracket is configured to couple to a rack;
    wherein the second mounting bracket is configured to couple the cable support arm to a component disposed within the rack; and
    wherein the first mounting bracket, or the second mounting bracket, or the base bracket, or a combination thereof, includes at least one vertical sliding mechanism independent from the hinge and configured to position the cable support arm in a plurality of vertical positions relative to the rack while the cable support arm is coupled to the rack.

26. The system of claim 25, wherein the cable support arm comprises a vertical retention mechanism configured to hold the at least one vertical sliding mechanism in a raised vertical position.

27. The system of claim 25, wherein the at least one vertical sliding mechanism comprises a member slidingly engaged along a closed slot including a vertical path extending to a horizontal path.

28. A system for managing electrical cables, comprising:
  a rack;
  a base bracket coupled to the rack; and
  a cable arm pivotably coupled to the base bracket via a mounting bracket, wherein the mounting bracket enables slideable movement of the cable arm along a generally vertical path relative to the base bracket while the cable arm is coupled to the rack, wherein the generally vertical path has upper and lower boundaries.

29. The system of claim 28, wherein the mounting bracket includes a J-shaped slot.

30. The system of claim 28, wherein the generally vertical path is substantially parallel with a rotational axis of the cable arm relative to the base bracket.

* * * * *

UNITED STATES PATENT AND TRADEMARK OFFICE
CERTIFICATE OF CORRECTION

PATENT NO. : 7,026,551 B2  Page 1 of 1
APPLICATION NO. : 10/428038
DATED : April 11, 2006
INVENTOR(S) : John P. Franz et al.

It is certified that error appears in the above-identified patent and that said Letters Patent is hereby corrected as shown below:

In column 3, line 59, delete "cable arm" and insert -- cable arm 30 --, therefor.

In column 4, line 18, in Claim 2, after "recited" insert -- in --.

Signed and Sealed this

Twenty-first Day of April, 2009

JOHN DOLL
*Acting Director of the United States Patent and Trademark Office*